US008963122B2

(12) United States Patent
Kusunoki et al.

(10) Patent No.: US 8,963,122 B2
(45) Date of Patent: Feb. 24, 2015

(54) SEMICONDUCTOR LIGHT EMITTING ELEMENT AND LIGHT EMITTING DEVICE

(71) Applicant: Toyoda Gosei Co., Ltd., Kiyosu-shi, Aichi-ken (JP)

(72) Inventors: Katsuki Kusunoki, Ichihara (JP); Hisao Sato, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 13/964,551

(22) Filed: Aug. 12, 2013

(65) Prior Publication Data

US 2014/0048767 A1 Feb. 20, 2014

(30) Foreign Application Priority Data

Aug. 16, 2012 (JP) .................................. 2012-180493

(51) Int. Cl.
*H01L 33/06* (2010.01)
*H01L 33/32* (2010.01)
(52) U.S. Cl.
CPC ................ *H01L 33/06* (2013.01); *H01L 33/32* (2013.01)
USPC .................. 257/13; 257/14; 257/94; 257/101; 257/103; 438/22; 438/37; 438/45; 438/46
(58) Field of Classification Search
CPC ......... H01L 33/32; H01L 33/24; H01L 33/04; H01L 33/12
See application file for complete search history.

(56) References Cited

U.S. PATENT DOCUMENTS

| 8,168,966 | B2 * | 5/2012 | Biwa et al. ...................... 257/13 |
| 8,309,948 | B2 * | 11/2012 | Kozaki ............................ 257/14 |
| 8,575,592 | B2 * | 11/2013 | Bergmann et al. ............... 257/13 |
| 2002/0053676 | A1 * | 5/2002 | Kozaki ............................ 257/88 |
| 2003/0205736 | A1 * | 11/2003 | Kozaki ............................ 257/200 |
| 2005/0098789 | A1 * | 5/2005 | Kozaki ............................ 257/97 |
| 2007/0164296 | A1 | 7/2007 | Miki et al. |
| 2007/0284564 | A1 * | 12/2007 | Biwa et al. ...................... 257/13 |
| 2008/0230794 | A1 * | 9/2008 | Yasuda et al. ................... 257/96 |
| 2010/0025684 | A1 | 2/2010 | Shinohara et al. |
| 2011/0133156 | A1 * | 6/2011 | Won et al. ....................... 257/13 |
| 2011/0187294 | A1 * | 8/2011 | Bergmann et al. ............ 315/363 |

FOREIGN PATENT DOCUMENTS

| JP | 2009-123717 A | 6/2009 |
| JP | 2009-283620 A | 12/2009 |
| JP | 4641812 B2 | 3/2011 |

* cited by examiner

*Primary Examiner* — Zandra Smith
*Assistant Examiner* — Jaehwan Oh
(74) *Attorney, Agent, or Firm* — Sughrue Mion, PLLC

(57) ABSTRACT

In a semiconductor light emitting element outputting light indicating green color by using a group III nitride semiconductor, light emission output is improved. A semiconductor light emitting element includes: an n-type cladding layer containing n-type impurities (Si); a light emitting layer laminated on the n-type cladding layer; and a p-type cladding layer containing p-type impurities and laminated on the light emitting layer. The light emitting layer has a barrier layer including first to fifth barrier layers and a well layer including first to fourth well layers, and has a multiple quantum well structure to sandwich one well layer by two barrier layers. The light emitting layer is configured such that the first to fourth well layers are set to have a composition to emit green light, and the first barrier layer is doped with n-type impurities, whereas the other barrier layers are not doped with n-type impurities.

7 Claims, 6 Drawing Sheets

FIG.2

| NAME OF COMPONENT | | | BASIC CONFIGURATION MATERIAL | DOPANT MATERIAL | DOPANT CONCENTRATION | THICKNESS | NOTES |
|---|---|---|---|---|---|---|---|
| SUBSTRATE 110 | | | SAPPHIRE | ✕ | ✕ | 900μm | |
| LAMINATED SEMICON- DUCTOR LAYER 100 | INTERMEDIATE LAYER 120 | | AlN | – | – | 30nm | |
| | BASE LAYER 130 | | GaN | – | – | 6μm | |
| | N-TYPE SEMICON- DUCTOR LAYER 140 | N-TYPE CONTACT LAYER 141 | GaN | Si | $3.5 \times 10^{18}/cm^3$ | 5μm | |
| | | N-TYPE CLADDING LAYER 142 / N-TYPE FIRST CLADDING LAYER 1421 | GaInN | Si | $3.5 \times 10^{18}/cm^3$ | 2.0nm | 30 PAIRS |
| | | N-TYPE SECOND CLADDING LAYER 1422 | GaN | Si | $3.5 \times 10^{18}/cm^3$ | 2.0nm | |
| | LIGHT EMITTING LAYER 150 | BARRIER LAYER 151 / FIRST BARRIER LAYER 1511 | GaN | Si | $1.5 \times 10^{17}/cm^3$ | 10.5nm | |
| | | WELL LAYER 152 / FIRST WELL LAYER 1521 | GaInN | – | – | 3.0nm | RW |
| | | BARRIER LAYER 151 / SECOND BARRIER LAYER 1512 | GaN | – | – | 10.5nm | |
| | | WELL LAYER 152 / SECOND WELL LAYER 1522 | GaInN | – | – | 3.0nm | RW |
| | | BARRIER LAYER 151 / THIRD BARRIER LAYER 1513 | GaN | – | – | 10.5nm | |
| | | WELL LAYER 152 / THIRD WELL LAYER 1523 | GaInN | – | – | 3.0nm | |
| | | BARRIER LAYER 151 / FOURTH BARRIER LAYER 1514 | GaN | – | – | 10.5nm | |
| | | WELL LAYER 152 / FOURTH WELL LAYER 1524 | GaInN | – | – | 3.0nm | |
| | | BARRIER LAYER 151 / FIFTH BARRIER LAYER 1515 | GaN | – | – | 8.0nm | |
| | P-TYPE SEMICON- DUCTOR LAYER 160 | P-TYPE CLADDING LAYER 161 | AlGaN | Mg | $2.5 \times 10^{19}/cm^3$ | 8.0nm | |
| | | P-TYPE CONTACT LAYER 162 / P-TYPE FIRST CONTACT LAYER 1621 | GaN | Mg | $2.0 \times 10^{19}/cm^3$ | 135nm | |
| | | P-TYPE SECOND CONTACT LAYER 1622 | GaN | Mg | $1.8 \times 10^{20}/cm^3$ | 25nm | |

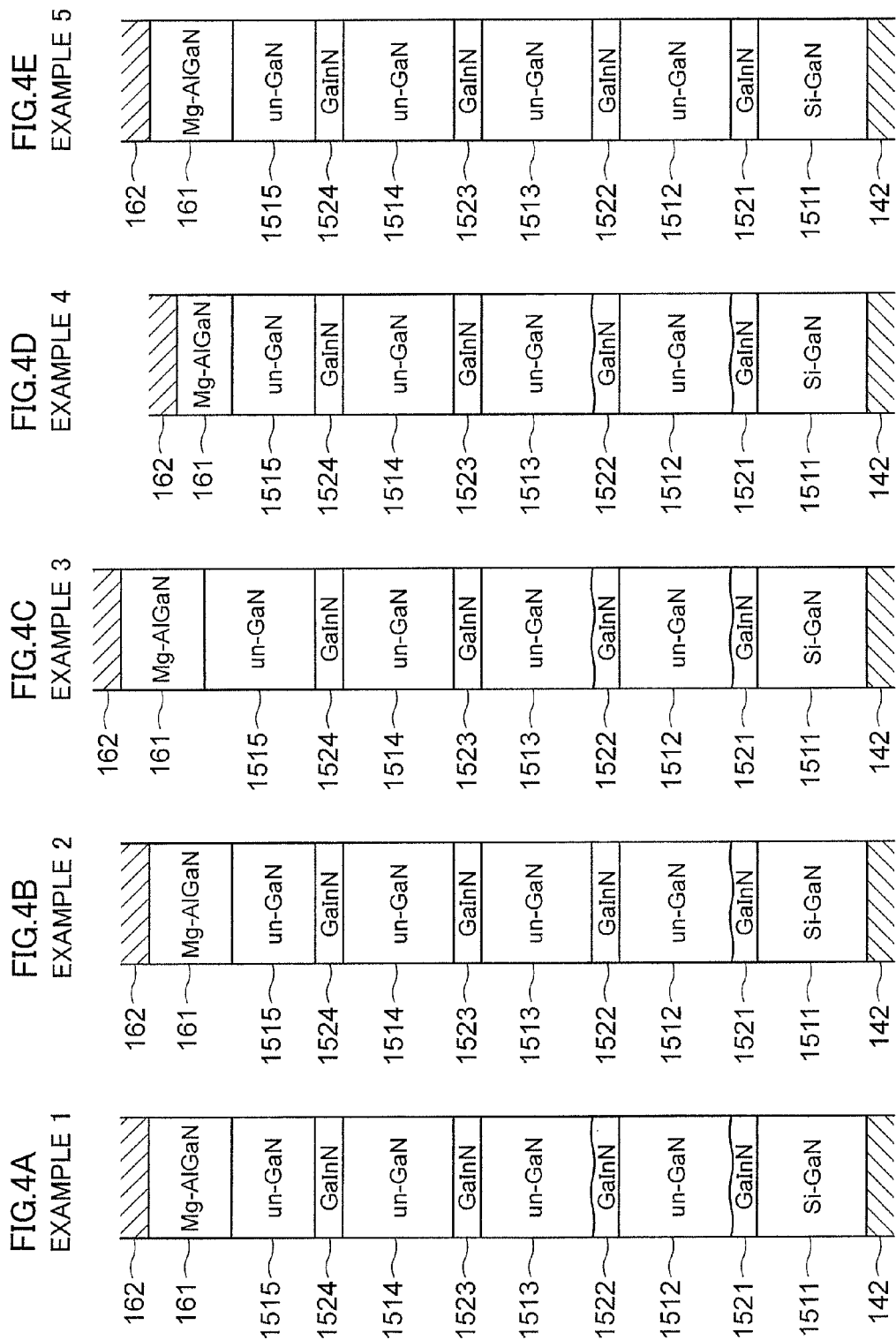

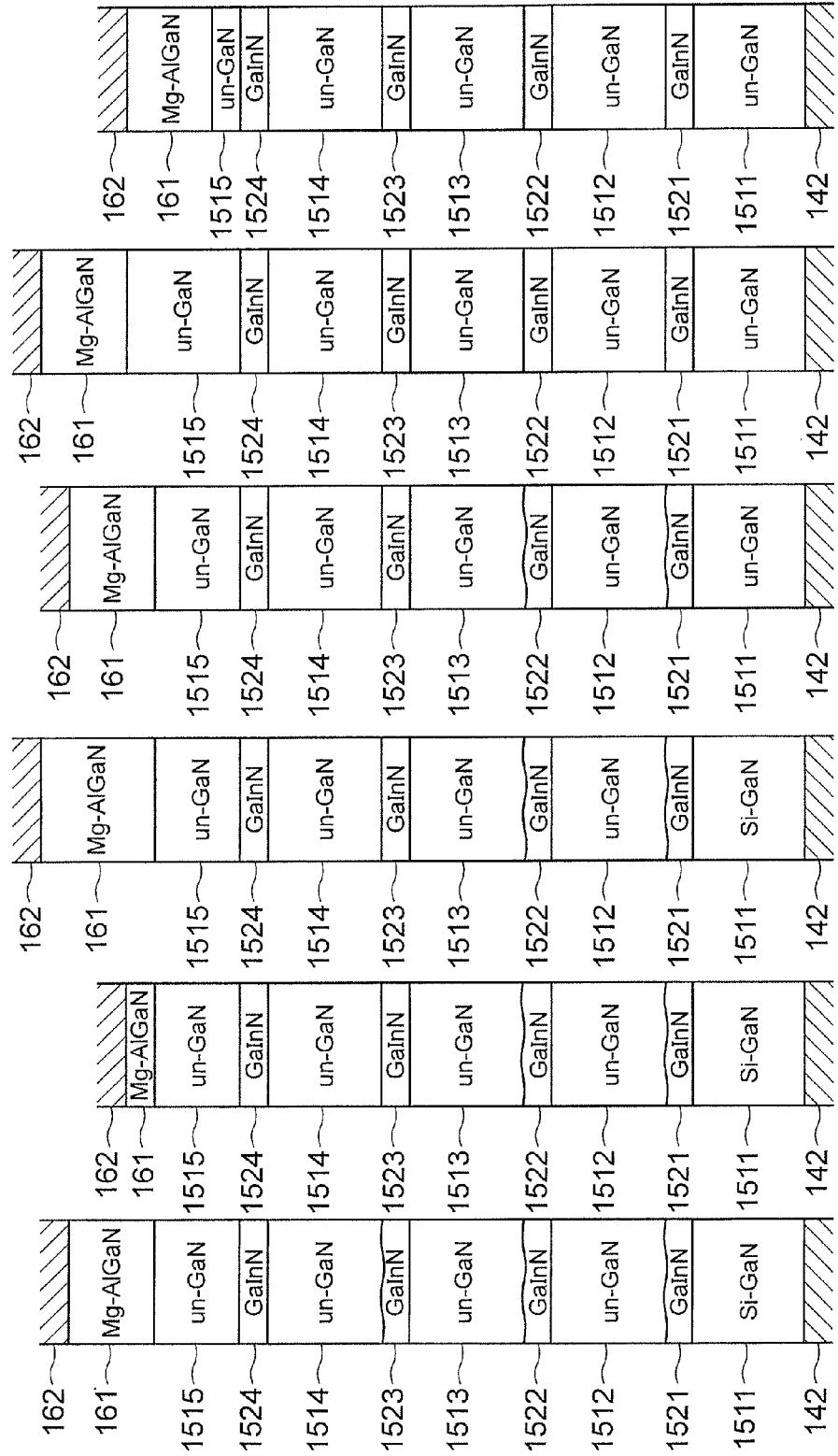

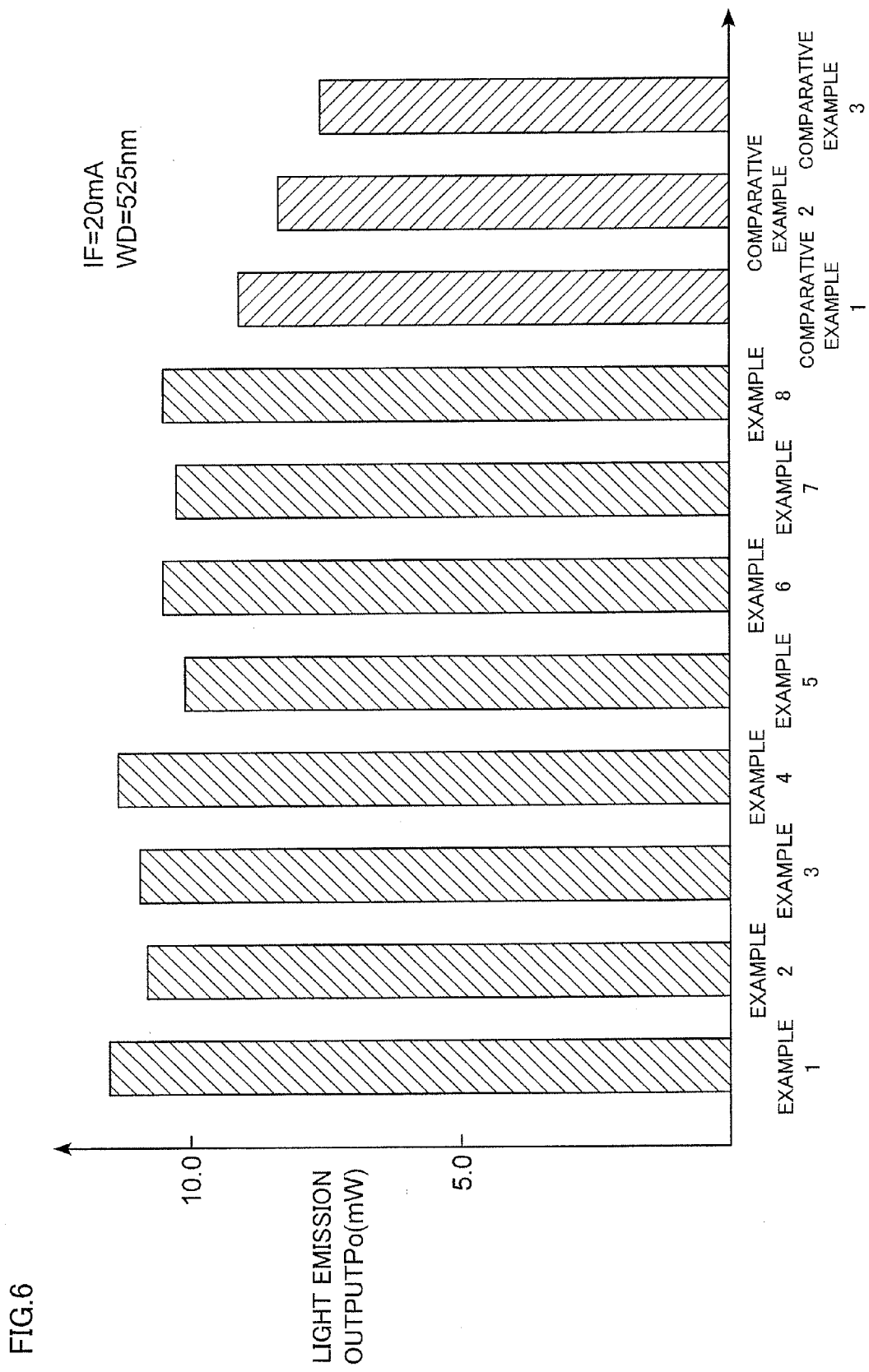

SEMICONDUCTOR LIGHT EMITTING ELEMENT AND LIGHT EMITTING DEVICE

CROSS REFERENCE TO RELATED APPLICATIONS

This application is based on and claims priority under 35 USC §119 from Japanese Patent Application No. 2012-180493 filed Aug. 16, 2012, incorporated herein by reference in its entirety.

BACKGROUND

1. Technical Field

The present invention relates to a semiconductor light emitting element using a group III nitride semiconductor and a light emitting device using a semiconductor light emitting element.

2. Related Art

In general, a semiconductor light emitting element using a group III nitride semiconductor is formed by arranging a light emitting layer including the group III nitride semiconductor between an n-type of group III nitride semiconductor layer containing n-type impurities for generating electrons as a carrier and a p-type of group III nitride semiconductor layer containing p-type impurities for generating holes as a carrier. In a semiconductor light emitting element in this type, it is known that the light emitting layer is configured with a multiple quantum well structure in which plural well layers and plural barrier layers are alternately laminated (refer to Japanese Patent Application Laid-Open Publication No. 2009-283620). In addition, in Japanese Patent Application Laid-Open Publication No. 2009-283620, it is described that light of a wavelength indicating green color is outputted from the light emitting layer by adjusting the composition of the group III nitride semiconductor constituting the plural well layers.

However, in the semiconductor light emitting element using the group III nitride semiconductor, in a case of employing a configuration that emits light of the wavelength indicating green color, large deformation is apt to occur in the light emitting layer and internal quantum efficiency tends to be reduced, to thereby reduce light emission output compared to a case of employing a configuration that emits light of blue color or ultraviolet light.

It is an object of the present invention to improve light emission output in a semiconductor light emitting element that emits light of a wavelength indicating green color by use of a group III nitride semiconductor.

SUMMARY

According to an aspect of the present invention, there is provided a semiconductor light emitting element including: an n-type semiconductor layer that is composed of a group III nitride semiconductor doped with an n-type impurity; a light emitting layer that is laminated on the n-type semiconductor layer and composed of a group III nitride semiconductor, the light emitting layer emitting light having a wavelength of not less than 500 nm and not more than 570 nm by passing a current; and a p-type semiconductor layer that is laminated on the light emitting layer and composed of a group III nitride semiconductor doped with a p-type impurity. The light emitting layer includes: at least four well layers that are composed of a group III nitride semiconductor; and at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at the interface portion with the p-type semiconductor layer, wherein, of the at least five barrier layers, one n-side barrier layer provided at an interface portion with the n-type semiconductor layer is doped with the n-type impurity, and, of the at least five barrier layers, at least four barrier layers except for the n-side barrier layer are not doped with the n-type impurity.

In such a semiconductor light emitting element, of the at least five barrier layers, each of at least four barrier layers except for one p-side barrier layer provided at the interface portion with the p-type semiconductor layer has a first thickness, and, of the at least five barrier layers, the p-side barrier layer has a second thickness that is smaller than the first thickness.

Moreover, the p-type semiconductor layer includes a p-type cladding layer laminated on the light emitting layer and a p-type contact layer laminated on the p-type cladding layer, and the p-type cladding layer has a thickness larger than a thickness of each of the at least four well layers and not more than the second thickness of the p-side barrier layer.

Further, of the at least four well layers, each of a first well layer nearest the n-type semiconductor layer and a second well layer nearest the n-type semiconductor layer next after the first well layer is configured to have a non-uniform thickness, and, of the at least four well layers, each of at least two layers except for the first well layer and the second well layer is configured to have a uniform thickness.

Further, the n-type semiconductor layer has a superlattice structure configured by alternately laminating a first layer composed of a group III nitride semiconductor and a second layer composed of a group III nitride semiconductor having a composition different from a composition of the group III nitride semiconductor constituting the first layer.

Still further, each of the at least five barrier layers is composed of GaN and each of the at least four well layers is composed of GaInN, and each of the at least four well layers is set to have a common thickness and a common composition.

Moreover, according to another aspect of the present invention, there is provided a light emitting device including: a base section in which a first wiring and a second wiring are formed; and a semiconductor light emitting element that emits light by passing a current via the first wiring and the second wiring, the semiconductor light emitting element including: an n-type semiconductor layer that is composed of a group III nitride semiconductor doped with an n-type impurity; a light emitting layer that is laminated on the n-type semiconductor layer and composed of a group III nitride semiconductor, the light emitting layer emitting light having a wavelength of not less than 500 nm and not more than 570 nm by passing a current; a p-type semiconductor layer that is laminated on the light emitting layer and composed of a group III nitride semiconductor doped with a p-type impurity; a p-side electrode for electrically connecting the p-type semiconductor layer and the first wiring; and an n-side electrode for electrically connecting the n-type semiconductor layer and the second wiring. The light emitting layer includes: at least four well layers that are composed of a group III nitride semiconductor; and at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at an interface portion with the p-type semiconductor layer, wherein, of the at least five barrier layers, one n-side barrier layer provided at the interface portion with the n-type semiconductor layer is doped with the n-type impurity, and, of the at least five barrier layers, at least four barrier layers except for the n-side barrier layer are not doped with the n-type impurity.

According to the present invention, it is possible to improve light emission output in the semiconductor light emitting element that emits light of the wavelength indicating green color by use of the group III nitride semiconductor.

BRIEF DESCRIPTION OF THE DRAWINGS

An exemplary embodiment of the present invention will be described in detail based on the following figures, wherein:

FIG. 2 is a diagram explaining materials or the like constituting each component of the semiconductor light emitting element shown in FIG. 1;

FIGS. 4A to 4E are diagrams showing structures of light emitting layers and peripheries thereof in the semiconductor light emitting elements in Examples 1 to 5, respectively;

FIGS. 5A to 5F are diagrams showing structures of light emitting layers and peripheries thereof in the semiconductor light emitting elements in Examples 6 to 8 and Comparative Examples 1 to 3, respectively; and FIG. 6 is a graph showing light emission outputs by the semiconductor light emitting elements according to Examples 1 to 8 and Comparative Examples 1 to 3.

DETAILED DESCRIPTION

Figure 1:
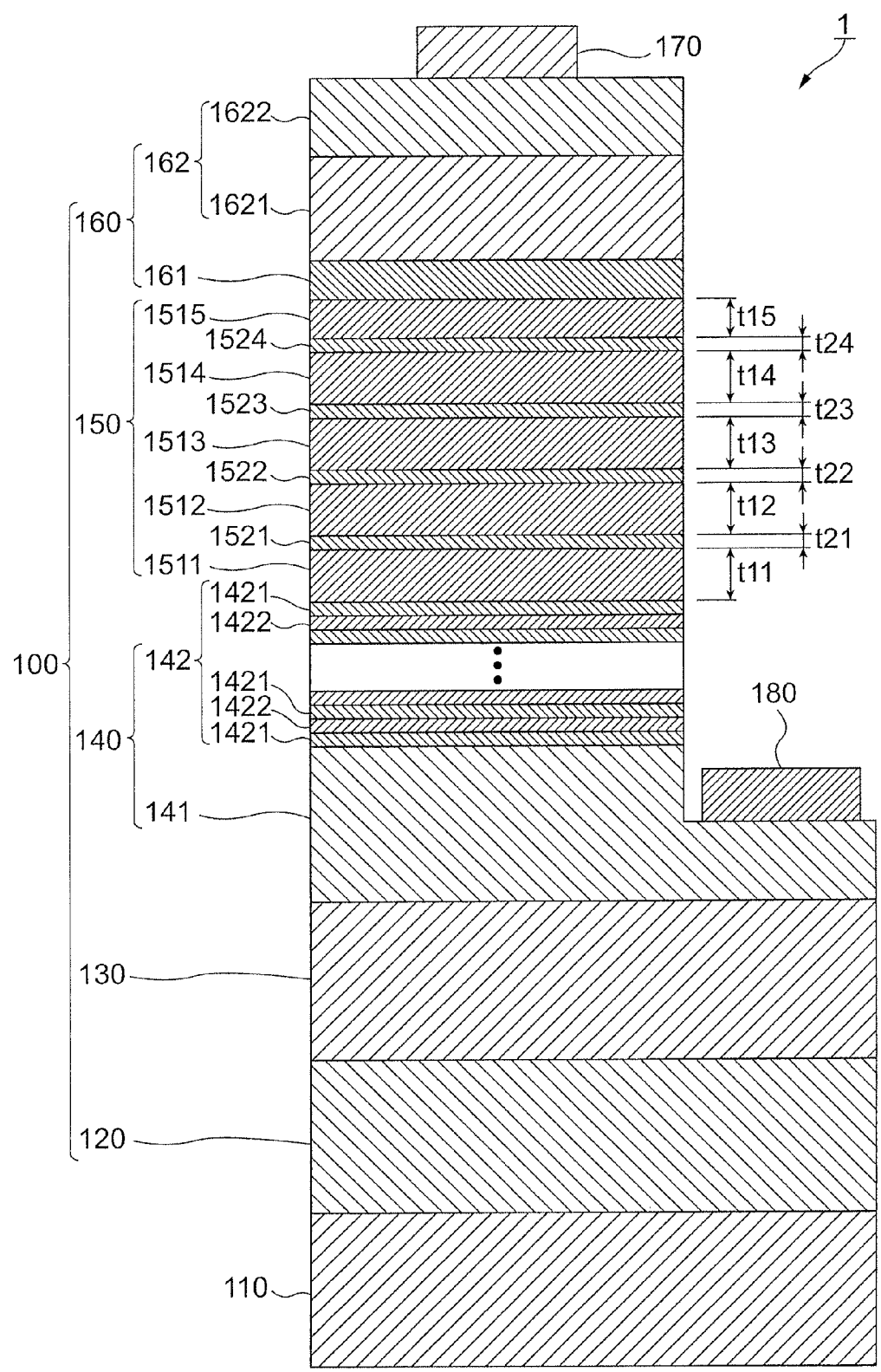
FIG. 1 is a vertical cross-sectional view of a semiconductor light emitting element to which an exemplary embodiment is applied.

Hereinafter, an exemplary embodiment according to the present invention will be described in detail with reference to accompanying drawings. It should be noted that there are some cases where a size or a thickness of each component in the drawings that are referred to in the following description is different from a dimension of an actual semiconductor light emitting element and the like.

FIG. 1 shows a vertical cross-sectional view of a semiconductor light emitting element (a light emitting diode) 1 to which the exemplary embodiment is applied.
(Semiconductor Light Emitting Element)

The semiconductor light emitting element 1 includes: a substrate 110; an intermediate layer 120 laminated on the substrate 110; and a base layer 130 laminated on the intermediate layer 120. The semiconductor light emitting element 1 also includes: an n-type semiconductor layer 140 laminated on the base layer 130; a light emitting layer 150 laminated on the n-type semiconductor layer 140; and a p-type semiconductor layer 160 laminated on the light emitting layer 150. Here, the n-type semiconductor layer 140 includes an n-type contact layer 141 laminated on the base layer 130 and an n-type cladding layer 142, which is laminated on the n-type contact layer 141 and on which the light emitting layer 150 is laminated. On the other hand, the p-type semiconductor layer 160 includes a p-type cladding layer 161 laminated on the light emitting layer 150 and a p-type contact layer 162 laminated on the p-type cladding layer 161. It should be noted that, in the following description, these intermediate layer 120, base layer 130, n-type semiconductor layer 140, light emitting layer 150 and p-type semiconductor layer 160 will be collectively referred to as a laminated semiconductor layer 100 in some cases as necessary.

Further, the semiconductor light emitting element 1 includes a p-side electrode 170 laminated on part of the p-type semiconductor layer 160 (more specifically, on the p-type contact layer 162) and an n-side electrode 180 laminated on part of a semiconductor exposure surface of the n-type semiconductor layer 140, which is exposed by cutting out part of each of the p-type semiconductor layer 160, light emitting layer 150 and n-type semiconductor layer 140 of the laminated semiconductor layer 100. It should be noted that, in the semiconductor exposure surface, on which the n-side electrode 180 is formed, the n-type contact layer 141 in the n-type semiconductor layer 140 is exposed. Moreover, in some cases, a transparent conductive layer having transparency to light emitted from the light emitting layer 150 and conductivity is formed as necessary between the p-type semiconductor layer 160 and the p-side electrode 170.

In the semiconductor light emitting element 1, the light emitting layer 150 is configured to emit light by setting the p-side electrode 170 as a positive electrode and the n-side electrode 180 as a negative electrode to pass a current from the p-side electrode 170 to the n-side electrode 180. It should be noted that the semiconductor light emitting element 1 is a light emitting diode of the face-up type in which light outputted from the light emitting layer 150 is extracted from the side on which the p-side electrode 170 and the n-side electrode 180 are formed.

Next, each component of the semiconductor light emitting element 1 will be described in more detail.

Here, FIG. 2 is a diagram explaining materials or the like constituting each component of the semiconductor light emitting element 1 shown in FIG. 1. In the following description, the configuration of the semiconductor light emitting element 1 will be described with reference to FIG. 2 in addition to FIG. 1.

It should be noted that, in the following description, AlGaN, GaN and GaInN as specific examples of a group III nitride semiconductor are described with the compositional ratio of each element being omitted in some cases.
<Substrate>

The substrate 110 can be selected to be used from various kinds of substrates without any limitation. For example, a substrate 110 composed of sapphire, SiC, silicon, GaN or the like can be used.

In this specific example, sapphire in which C-plane is a principal plane is used as the substrate 110. In this specific example, the thickness of the substrate 110 is 900 μm. In the case where the sapphire is used for the substrate 110, the intermediate layer 120 (the buffer layer) may be formed on the C-plane of the sapphire.

Further, as the substrate 110 used in the present invention, a processed substrate described in Japanese Patent Application Laid-Open Publication No. 2009-123717 (plural convex portions not parallel to a C-plane of a sapphire single crystal are formed on the C-plane, thereby forming a surface of a substrate) can be preferably applied. In a case where such a processed substrate is used as the substrate 110, since deformation of crystals in the light emitting layer 150 is mediated by an asperity shape provided on the surface of the substrate 110 at the time of producing (laminating), it becomes possible to improve light emission output of the semiconductor light emitting element 1 because of an synergistic effect of a defect reduction effect and improved light extraction efficiency due to reflection of light at an asperity interface between the substrate and an epitaxial layer caused by crystal growth on the asperity surface. Especially, it is desirable for formation of the largely-deformed light emitting layer 150 outputting green light.

Here, with respect to the shape of the processed substrate, in a case where, for example, a projection portion is in a conical shape, it is preferable that the height of the projection portion is in the range of 0.3 μm to 1.5 μm and the diameter of a bottom surface of the projection portion is in the range of 0.5 μm to 2.0 μm. The shape of the projection portion is not limited to the conical shape, and the projection portion may be in other shapes.

<Laminated Semiconductor Layer>

The laminated semiconductor layer 100 is composed of, for example, a group III nitride semiconductor, which is configured by laminating the intermediate layer 120, the base layer 130, the n-type semiconductor layer 140, the light emitting layer 150 and the p-type semiconductor layer 160 on the substrate 110 in this order as shown in FIG. 1. Here, in the n-type semiconductor layer 140, an electron is a carrier, while in the p-type semiconductor layer 160, a hole is a carrier.

Hereinafter, each of the layers constituting the laminated semiconductor layer 100 will be described in order.

[Intermediate Layer]

The intermediate layer 120 has a function of mediating the difference in lattice constant between the substrate 110 and the base layer 130, and especially in the case where the substrate 110 is composed of a sapphire whose C-plane is a principal plane, serves to facilitate the formation of a single crystal layer which is C-axis oriented on the (0001) plane (the C-plane) of the substrate 110. Consequently, if a single crystal base layer 130 is laminated on the intermediate layer 120, the base layer 130 having more excellent crystallinity can be laminated. It should be noted that formation of the intermediate layer 120 is preferably carried out in the present invention, but not necessarily needed.

The intermediate layer 120 is preferably composed of polycrystal $Al_xGa_{1-x}N$ ($0 \le x \le 1$), and more preferably, composed of single crystal $Al_xGa_{1-x}N$ ($0 \le x \le 1$). In particular, AlN is preferable because a base layer with excellent quality is apt to be obtained.

The intermediate layer 120 can be provided with a thickness of 10 nm to 500 nm. If the thickness of the intermediate layer 120 is less than 10 nm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 500 nm, there is a possibility that the time of forming process of the intermediate layer 120 becomes longer though there is no change to the function of the intermediate layer 120, and accordingly the productivity is decreased. In the exemplary embodiment, the intermediate layer 120 is configured by use of AlN and the thickness of the intermediate layer 120 is set at 30 nm. In addition, in this specific example, n-type impurities and p-type impurities are not added to the intermediate layer 120.

It should be noted that the intermediate layer 120 with excellent crystallinity can be obtained by forming by an MOCVD method; however, a sputtering method under optimized conditions can form a semiconductor layer having more excellent crystallinity than that formed by the MOCVD method.

[Base Layer]

As the base layer 130, $Al_xGa_yIn_zN$ ($0 \le x \le 1$, $0 \le y \le 1$, $0 \le z \le 1$, $x+y+z=1$) can be used, but it is preferable to use $Al_xGa_{1-x}N$ ($0 \le x < 1$) because the base layer 130 with excellent crystallinity can be formed. In the exemplary embodiment, GaN is used as the base layer 130.

The thickness of the base layer 130 is preferably 100 nm or more, more preferably 500 nm or more, and most preferably 1000 nm (1 μm) or more. The base layer 130 having excellent crystallinity is likely to be obtained with these layer thickness or more. In this specific example, since the above-described processed substrate is used as the substrate 110, the thickness of the base layer 130 is set at 6 μm because it is necessary to make the thickness of the base layer 130 larger than the height of the asperities to flatten the surface.

To improve the crystallinity of the base layer 130, it is desirable that the base layer 130 is not doped with impurities. However, if conductivity of n-type is needed for reducing a forward voltage VF in the semiconductor light emitting element 1, donor impurities (n-type impurities) can be added.

In the exemplary embodiment, the base layer 130 is configured not to be doped with impurities.

[N-Type Semiconductor Layer]

The n-type semiconductor layer 140, in which electrons are the carrier, includes the n-type contact layer 141 laminated on the base layer 130 and the n-type cladding layer 142, which is laminated on the n-type contact layer 141 and on which the light emitting layer 150 is laminated as described above. It should be noted that the above-described base layer 130 may be included in the n-type semiconductor layer 140.

Of these, the n-type contact layer 141 is a layer for providing the n-side electrode 180. In the exemplary embodiment, GaN is used as the n-type contact layer 141.

Moreover, the n-type contact layer 141 is preferably doped with n-type impurities, and it is preferable to contain the n-type impurities having a concentration of $1 \times 10^{17}/cm^3$ to $1 \times 10^{20}/cm^3$, and a concentration of $1 \times 10^{18}/cm^3$ to $1 \times 10^{19}/cm^3$ is more preferable on the point that a good ohmic contact with the n-side electrode 180 can be maintained. As the n-type impurities, though not particularly limited, Si, Ge, Sn and so on are provided, and Si is preferably provided. In the exemplary embodiment, Si is used as a dopant material with which the n-type contact layer 141 is doped, and a dopant concentration thereof is set at $3.5 \times 10^{18}/cm^3$.

The total thickness of the n-type contact layer 141 is preferably set at 500 nm to 7000 nm (7 μm). If the thickness of the n-type contact layer 141 is in the above-described range, crystallinity of the group III nitride semiconductor is suitably maintained, and a proper forward voltage can be obtained. In the exemplary embodiment, the thickness of the n-type contact layer 141 is set at 5 μm.

The n-type cladding layer 142 performs injection of the carriers (the electrons here) into the light emitting layer 150 and confinement of the carriers, and in the exemplary embodiment, the n-type cladding layer 142 is configured as a layer containing a superlattice structure, which is preferable to form the light emitting layer 150 with large deformation that emits green light. In particular, the GaInN/GaN structure is a similar structure of the light emitting layer, and is preferable in terms of mediating deformation.

To be described more specifically, the n-type cladding layer 142 contains a structure in which an n-type first cladding layer 1421 composed of the group III nitride semiconductor with a thickness of 10 nm or less and an n-type second cladding layer 1422 composed of the group III nitride semiconductor having a composition different from that of the n-side first layer and having a thickness of 10 nm or less are alternately laminated. The n-type cladding layer 142 has a structure that sandwiches a single n-type second cladding layer 1422 by two n-type first cladding layers 1421, and each of the side in contact with the n-type contact layer 141 and the side in contact with the light emitting layer 150 is the n-type first cladding layer 1421. It should be noted that, in this specific example, the thickness of each of the n-type first cladding layer 1421 and the n-type second cladding layer 1422 is set at 2.0 nm.

Here, the n-type cladding layer 142 in the exemplary embodiment is configured with 61 layers including 31 n-type first cladding layers 1421 and 30 n-type second cladding layers 1422 (30 pairs, refer to "Notes" in FIG. 2). However, this is merely a specific example, and the n-type cladding layer 142 is preferably configured with at least 11 n-type first cladding layers 1421 and at least 10 n-type second cladding layers 1422, for instance. The total thickness of the n-type cladding layer 142 is not particularly limited, but preferably 5 nm to 500 nm, and more preferably 5 nm to 200 nm.

Moreover, in the exemplary embodiment, the n-type first cladding layer 1421 and the n-type second cladding layer 1422 are configured with GaInN and GaN, respectively. In the case where the n-type cladding layer 142 containing GaInN is formed, it is desirable that the band gap of GaInN constituting the n-type first cladding layer 1421 is larger than that of GaInN of the light emitting layer 150. The In composition in GaInN constituting the n-type first cladding layer 1421 is desirably in the range of 0.5 atomic % to 3.0 atomic %.

In addition, each of the n-type first cladding layer 1421 and the n-type second cladding layer 1422 constituting the n-type cladding layer 142 is preferably doped with the n-type impurities, and the n-type impurity concentration is preferably in the range of $1.5 \times 10^{17}/cm^3$ to $1.5 \times 10^{20}/cm^3$, and more preferably in the range of $1.5 \times 10^{18}/cm^3$ to $1.5 \times 10^{19}/cm^3$. It is preferable to provide the n-type impurity concentration in these ranges in terms of maintaining excellent crystallinity and reducing operation voltage of the semiconductor light emitting element 1. As the n-type impurities for the n-type cladding layer 142, similar to those for the n-type contact layer 141 described above, Si, Ge, Sn and the like can be used, and Si and Ge are preferably used. In the exemplary embodiment, Si is used as a dopant material with which the n-type first cladding layer 1421 and the n-type second cladding layer 1422 constituting the n-type cladding layer 142 are doped, and a dopant concentration thereof is set at $3.5 \times 10^{18}/cm^3$.

[Light Emitting Layer]

The light emitting layer 150 of the exemplary embodiment has a so-called multiple quantum well structure in which barrier layers and well layers are alternately laminated. To be described more specifically, the light emitting layer 150 includes: a first barrier layer 1511 laminated on the n-type cladding layer 142 (the n-type first cladding layer 1421); a first well layer 1521 laminated on the first barrier layer 1511; a second barrier layer 1512 laminated on the first well layer 1521; a second well layer 1522 laminated on the second barrier layer 1512; a third barrier layer 1513 laminated on the second well layer 1522; a third well layer 1523 laminated on the third barrier layer 1513; a fourth barrier layer 1514 laminated on the third well layer 1523; a fourth well layer 1524 laminated on the fourth barrier layer 1514; and a fifth barrier layer 1515 laminated on the fourth well layer 1524, on which the p-type cladding layer 161 is laminated.

In this manner, the light emitting layer 150 of the exemplary embodiment is configured with 9 layers including 5 barrier layers (the first barrier layer 1511 to the fifth barrier layer 1515) and 4 well layers (the first well layer 1521 to the fourth well layer 1524). Moreover, the light emitting layer 150 has a structure in which a single well layer is sandwiched by two barrier layers. Then, in the light emitting layer 150, on a side in contact with the n-type semiconductor layer 140 (the n-type cladding layer 142), the first barrier layer 1511 is positioned, and on a side in contact with the p-type semiconductor layer 160 (the p-type cladding layer 161), the fifth barrier layer 1515 is positioned. Accordingly, in the exemplary embodiment, the first barrier layer 1511 and the fifth barrier layer 1515 function as an n-side barrier layer and a p-side barrier layer, respectively.

It should be noted that, in the following description, in the light emitting layer 150, the first barrier layer 1511, the second barrier layer 1512, the third barrier layer 1513, the fourth barrier layer 1514 and the fifth barrier layer 1515 are collectively referred to as a barrier layer 151 in some cases. On the other hand, in the following description, in the light emitting layer 150, the first well layer 1521, the second well layer 1522, the third well layer 1523 and the fourth well layer 1524 are collectively referred to as a well layer 152 in some cases.

Then, first, description will be given of a relationship between the thickness of each layer constituting the barrier layer 151 and the thickness between the layers.

In the barrier layer 151, the thicknesses of the first barrier layer 1511, the second barrier layer 1512, the third barrier layer 1513, the fourth barrier layer 1514 and the fifth barrier layer 1515 are assumed to be a first barrier thickness t11, a second barrier thickness t12, a third barrier thickness t13, a fourth barrier thickness t14 and a fifth barrier thickness t15, respectively. In this specific example, of the first barrier layer 1511 to the fifth barrier layer 1515, the first barrier layer 1511 that is nearest the n-type semiconductor layer 140 and the second barrier layer 1512 to the fourth barrier layer 1514 subsequent to the first barrier layer 1511 are set to have a common thickness (hereinafter, referred to as a first thickness) (t11=t12=t13=t14). On the other hand, of the first barrier layer 1511 to the fifth barrier layer 1515, the fifth barrier layer 1515 that is nearest the p-type semiconductor layer 160 is set to have a thickness less than the first thickness (hereinafter, referred to as a second thickness).

As the barrier layer 151 of the light emitting layer 150 that emits green light, it is preferable to set the thickness of each layer constituting the barrier layer at 3 nm to 30 nm. If the thickness is less than 3 nm, the top surface of each barrier layer is not formed sufficiently flat, to thereby cause deterioration of light emission efficiency or deterioration of aging properties. In addition, since the thickness of each barrier layer is insufficient, the light emission wavelength becomes insufficient, too. On the other hand, if the thickness of each barrier layer exceeds 30 nm, it is not preferable because increase in the driving voltage or deterioration of light emission efficiency is caused. It should be noted that, in this specific example, the first thickness and the second thickness are set at 10.5 nm and 8.0 nm, respectively.

Subsequently, description will be given of a relationship between the thickness of each layer constituting the well layer 152 and the thickness between the layers.

In the well layer 152, the thicknesses of the first well layer 1521, the second well layer 1522, the third well layer 1523 and the fourth well layer 1524 are assumed to be a first well thickness t21, a second well thickness t22, a third well thickness t23 and a fourth well thickness t24, respectively. In this specific example, all the first well layer 1521 to the fourth well layer 1524 are set to have a common thickness (hereinafter, referred to as a standard well thickness) (t21=t22=t23=t24). The thickness of each layer constituting the well layer 152 can be a thickness of a level by which a quantum effect is available, for example, 1 nm to 10 nm, and preferably 2 nm to 6 nm in terms of light emission output. It should be noted that, in this specific example, the standard well thickness is set at 3.0 nm.

Here, "common thickness" allows deviation due to manufacturing errors or measurement errors, and refers to, for example, a range of ±5% from a reference thickness.

In this specific example, of the first well layer 1521 to the fourth well layer 1524, the fourth well layer 1524 nearest the p-type semiconductor layer 160 and the third well layer 1523 nearest the p-type semiconductor layer 160 next after the fourth well layer 1524 have a structure with uniform thickness (a flat structure). In contrast, the first well layer 1521 nearest the n-type semiconductor layer 140 and the second well layer 1522 nearest the n-type semiconductor layer 140 next after the first well layer 1521 have a structure with non-uniform thickness (a non-flat structure).

Here, "thickness is uniform" means that the thickness of the target layer (film thickness) falls within ±10% of the average film thickness. On the other hand, "thickness is non-uniform" means that the film thickness does not fall within ±10% of the average film thickness. It should be noted that "average film thickness" can be obtained by an arithmetic method of the maximum film thickness and the minimum film thickness of the target layer. Each of the first barrier thickness t11 to the fifth barrier thickness t15 and the first well thickness t21 to the fourth well thickness t24 means the average film thickness of the layer. The flat layers and non-flat layers constituting the well layer 152 can be manufactured by the method described in, for example, Japanese Patent No. 4641812.

Measurement and determination whether the thicknesses of the first well layer 1521 to the fourth well layer 1524 are uniform or non-uniform can be achieved, for example, by observing cross-sectional TEM (transmission electron microscope) photographs of the light emitting layer 150 including the barrier layer 151 and the well layer 152. For example, by observing the cross section of the light emitting layer 150 in a TEM photograph taken with a magnification of 200-thousand times to 2 million times, unevenness in thicknesses of the first well layer 1521 to the fourth well layer 1524 can be measured. The maximum film thickness and the minimum film thickness of each of the first well layer 1521 to the fourth well layer 1524 can be obtained from a result of observation of each layer on at least two points with an interval of 20 μm or more in the cross-sectional TEM photograph.

It should be noted that, in the following description, of the first well layer 1521 to the fourth well layer 1524 constituting the well layer 152, a layer in which thickness thereof is set to be non-uniform (non-flat) (in this specific example, two layers, namely, the first well layer 1521 and the second well layer 1522) is referred to as a rough well (RW, refer to "Notes" in FIG. 2).

This time, description will be given of a relationship between the composition of each layer constituting the barrier layer 151 and the composition between the layers.

In the barrier layer 151, each of the first barrier layer 1511 to the fifth barrier layer 1515 is composed of GaN. However, there is a difference in that, whereas the first barrier layer 1511 nearest the n-type semiconductor layer 149 is doped with the n-type impurities, the barrier layers except for the first barrier layer 1511, namely, the second barrier layer 1512 to the fifth barrier layer 155 are not doped with the n-type impurities (and the p-type impurities).

Here, the concentration of the n-type impurities added to the first barrier layer 1511 is preferably in the range of $5.0 \times 10^{16}/cm^3$ to $1.5 \times 10^{19}/cm^3$, and more preferably in the range of $8.0 \times 10^{16}/cm^3$ to $1.0 \times 10^{18}/cm^3$. As the n-type impurities for the first barrier layer 1511, similar to those for the n-type contact layer 141 or the n-type cladding layer 142 described above, Si, Ge, Sn and the like can be used, and Si and Ge are preferably used. In the exemplary embodiment, Si is used as a dopant material with which the first barrier layer 1511 is doped, and a dopant concentration thereof is set at $1.5 \times 10^{17}/cm^3$.

It should be noted that, in the exemplary embodiment, of the first barrier layer 1511 to the fifth barrier layer 1515 constituting the barrier layer 151, the first barrier layer 1511 is doped with the n-type impurities (here, Si) and the other layers, namely, the second barrier layer 1512 to the fifth barrier layer 1515 are not doped with the n-type impurities; however, there is a possibility that, depending on purity of a source gas, manufacturing conditions or the like, some of the second barrier layer 1512 to the fifth barrier layer 1515 contain a small amount of n-type impurities. However, in the present invention, the n-type impurities that are inevitably contained in some of the second barrier layer 1512 to the fifth barrier layer 1515 by such a reason are not included in the category of "doping".

Subsequently, description will be given of a relationship between the composition of each layer constituting the well layer 152 and the composition between the layers.

In the well layer 152, each of the first well layer 1521 to the fourth well layer 1524 is composed of GaInN. In addition, different from the barrier layer 151, the well layer 152 (the first well layer 1521 to the fourth well layer 1524) has no layer doped with the n-type impurities (and the p-type impurities).

Here, the value of y in $Ga_{1-y}In_yN$ that constitutes the first well layer 1521 to the fourth well layer 1524 is determined in accordance with a target light emission wavelength of the semiconductor light emitting element 1. In the exemplary embodiment, the target light emission wavelength is selected from a range of wavelength region that indicates green color (500 nm to 570 nm), and the value of y is preferably in the range of $0.05<y<0.30$, and more preferably, in the range of $0.10<y<0.20$. The first well layer 1521 to the fourth well layer 1524 are set to have a common thickness and a common composition so as to output light of a common wavelength.

[P-Type Semiconductor Layer]

The p-type semiconductor layer 160, in which holes are the carrier, includes the p-type cladding layer 161 laminated on the light emitting layer 150 and the p-type contact layer 162, which is laminated on the p-type cladding layer 161 and on which the p-side electrode 170 is laminated. However, it is possible that the p-type contact layer 162 also serves as the p-type cladding layer 161.

The p-type cladding layer 161 performs injection of the carriers (the holes here) into the light emitting layer 150 and confinement of carriers within the light emitting layer 150. The material of p-type cladding layer 161 is not particularly limited as long as the band gap energy of the composition thereof is larger than that of the light emitting layer 150 and carriers can be confined within the light emitting layer 150; however, $Al_xGa_{1-x}N$ ($0<x\leq0.4$) can be preferably used.

It is preferable that the p-type cladding layer 161 is composed of such AlGaN in terms of confinement of carriers within the light emitting layer 150. The thickness of the p-type cladding layer 161 is preferably larger than that of any one layer in the well layer 152 and not more than that of one layer in the barrier layer 151. Moreover, in the case where the layers in the barrier layer 151 are configured to have different thicknesses, it is preferable that the thickness of the p-type cladding layer 161 is not more than the thickness of a layer having the smallest thickness in the layers of the barrier layer 151. The thickness of the p-type cladding layer 161 is preferably in the range of 3 nm to 9 nm, and more preferably, in the range of 5 nm to 8 nm. Since the thickness of the p-type cladding layer 161 containing Al makes an effect on deformation in the light emitting layer 150, it is suitable to select the thickness from the above-described ranges. In this specific example, the p-type cladding layer 161 is configured by use of $Al_{0.09}Ga_{0.91}N$, and the thickness of the p-type cladding layer 161 is set at 8.0 nm.

The p-type impurity concentration in the p-type cladding layer 161 is preferably $1 \times 10^{18}/cm^3$ to $1 \times 10^{21}/cm^3$, and more preferably $1 \times 10^{19}/cm^3$ to $1 \times 10^{20}/cm^3$. It is preferable that the p-type impurity concentration is in the above ranges in terms of capability of suppressing deterioration of crystallinity in both of the p-type cladding layer 161 and the p-type contact layer 162 laminated on the p-type cladding layer 161. In the exemplary embodiment, Mg is used as a dopant material with which the p-type cladding layer 161 is doped, and a dopant concentration thereof is set at $2.5 \times 10^{19}/cm^3$.

Moreover, similar to the above-described n-type cladding layer 142, the p-type cladding layer 161 may have a superlattice structure, and in this case, it is preferable to have an alternating structure of AlGaN and another AlGaN having different compositional ratio or an alternating structure of AlGaN and GaN having different compositions.

The p-type contact layer 162 is a layer for providing the p-side electrode 170 directly or via a not-shown transparent conductive layer. In the exemplary embodiment, the p-type contact layer 162 includes a p-type first contact layer 1621 laminated on the p-type cladding layer 161 and a p-type second contact layer 1622, which is laminated on the p-type first contact layer 1621 and on which the transparent conductive layer or the p-side electrode 170 is laminated. Here, each of the p-type first contact layer 1621 and the p-type second contact layer 1622 is preferably composed of $Al_xGa_{1-x}N$ ($0 \leq x \leq 0.4$). It is preferable that Al composition is in the above-described range in terms of capability of maintaining excellent crystallinity and good ohmic contact with the transparent conductive layer (or the p-side electrode 170). In this specific example, GaN is used as each of the p-type first contact layer 1621 and the p-type second contact layer 1622 that constitute the p-type contact layer 162.

Moreover, it is preferable that each of the p-type first contact layer 1621 and the p-type second contact layer 1622 that constitute the p-type contact layer 162 is doped with the p-type impurities, and the concentration of the contained p-type impurities is preferably $1 \times 10^{18}/cm^3$ to $1 \times 10^{21}/cm^3$, and more preferably $1 \times 10^{19}/cm^3$ to $5 \times 10^{20}/cm^3$. It is preferable that the p-type impurity concentration is in the above range in the point that it becomes possible to maintain good ohmic contact, prevent cracking and maintain excellent crystallinity. However, it is preferable to set the p-type impurity concentration in the p-type first contact layer 1621 lower than the p-type impurity concentration in the p-type second contact layer 1622. This intends to suppress optical absorption due to Mg in the p-type semiconductor layer 160 except for a region for making a contact with the transparent conductive layer. In the exemplary embodiment, Mg is used as a dopant material with which the p-type first contact layer 1621 and the p-type second contact layer 1622 are doped. Moreover, a dopant concentration in the p-type first contact layer 1621 is set at $2.0 \times 10^{19}/cm^3$, and a dopant concentration in the p-type second contact layer 1622 is set at $1.8 \times 10^{20}/cm^3$.

The total thickness of the p-type contact layer 162 is not particularly limited, but is preferably 10 nm to 500 nm, and more preferably 50 nm to 200 nm. It is preferable to provide the thickness of the p-type contact layer 162 in these ranges in the point that deterioration of light emission output in the semiconductor light emitting element 1 is suppressed. In the exemplary embodiment, the thickness of the p-type first contact layer 1621 is set at 135 nm, and the thickness of the p-type second contact layer 1622 is set at 25 nm.

<P-Side Electrode>

The p-side electrode 170 is configured by laminating several kinds of metal layers. The p-side electrode 170 of the exemplary embodiment also serves as a so-called bonding pad, and a not-shown bonding wire is connected to a surface exposed to the outside. Moreover, it is more preferable to form the transparent conductive layer between the p-side electrode 170 and the p-type contact layer 162 because an electrode structure capable of supplying a uniform current to the light emitting layer 150 can be obtained by low ohmic contact resistance and a current diffusion effect. As a material of the transparent conductive layer, ITO or IZO containing indium oxide, which has low resistance and high transmittance to green light, is preferable.

<N-Side Electrode>

Similar to the p-side electrode 170, the n-side electrode 180 is configured by laminating several kinds of metal layers. The n-side electrode 180 of the exemplary embodiment also serves as a so-called bonding pad, and a not-shown bonding wire is connected to a surface exposed to the outside.

(Light Emitting Device)

Figure 3A:
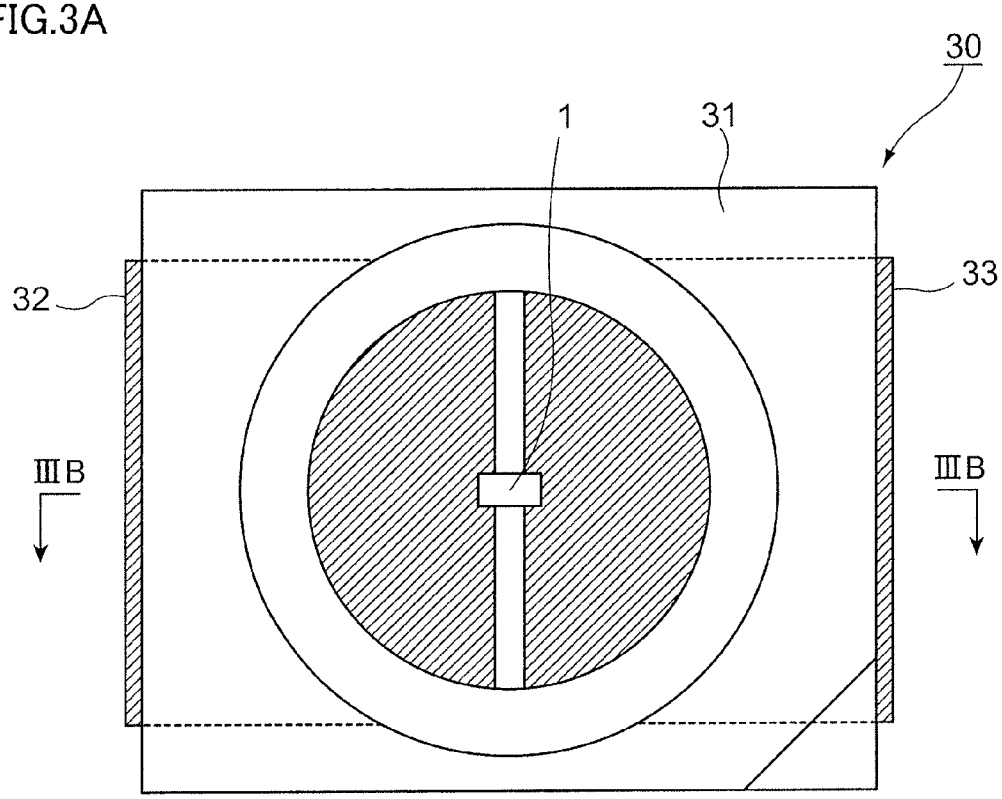
FIGS. 3A and 3B are diagrams showing an example of a configuration of a light emitting device that mounts the semiconductor light emitting element.
Figure 3B:
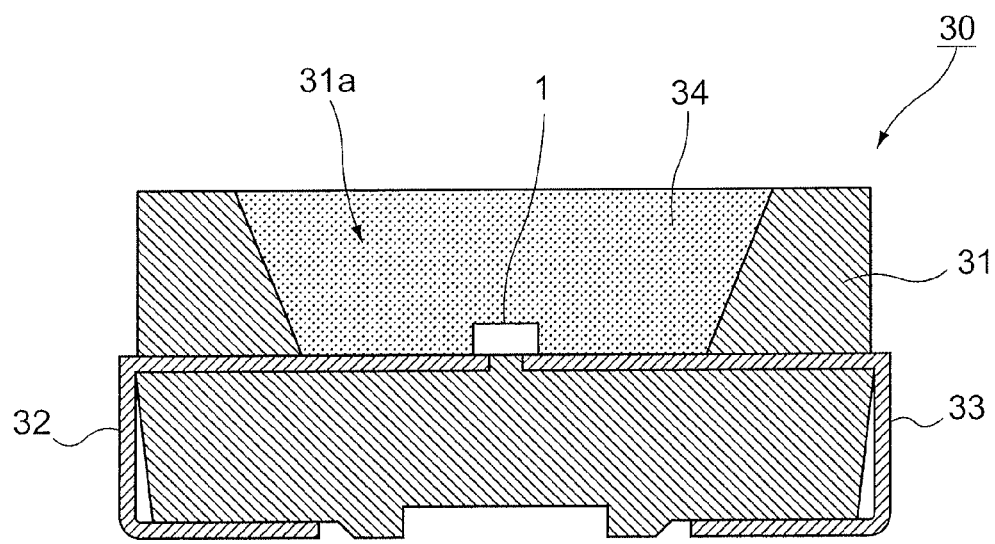

FIGS. 3A and 3B are diagrams showing a specific example of a configuration of a light emitting device 30 that mounts the above-described semiconductor light emitting element 1. Here, FIG. 3A shows a top surface view of the light emitting device 30, and FIG. 3B is a IIIB-IIIB cross-sectional view in FIG. 3A. It should be noted that the light emitting device 30 shown in FIGS. 3A and 3B is referred to as "light emitting chip", "light emitting diode", "LED" or "lamp" in some cases.

The light emitting device 30 includes: a housing 31, as a specific example of a base section, on one side of which a concave section 31a is formed; a p-lead section 32 and an n-lead section 33 composed of lead frames formed in the housing 31; the semiconductor light emitting element 1 attached to a bottom surface of the concave section 31a; and a sealing section 34 provided to cover the concave section 31a. It should be noted that an illustration of the sealing section 34 is omitted in FIG. 3A.

The housing 31 as a specific example of the base section is formed by injection molding of a white thermoplastic resin on a metal lead section including the p-lead section 32 as a specific example of a first wiring and the n-lead section 33 as a specific example of a second wiring.

The p-lead section 32 and the n-lead section 33 are metal plates having a thickness of the order of 0.1 mm to 0.5 mm, and configured by laminating several μm of nickel, titanium, gold or silver as a plating layer on an alloy of iron and copper, for example, which is a metal having excellent workability and thermal conductivity, as a base. Then, in the exemplary embodiment, part of each of the p-lead section 32 and the n-lead section 33 is exposed at the bottom surface of the concave section 31a. Further, one end portion of each of the p-lead section 32 and the n-lead section 33 is exposed to the outside of the housing 31 and is bent from an outer wall surface toward a back surface side of the housing 31.

The semiconductor light emitting element 1 is attached by bonding or the like to the center portion of the bottom portion in the concave section 31a via the substrate 110 (refer to FIG. 1). Further, the p-lead section 32 and the p-side electrode 170 (refer to FIG. 1) in the semiconductor light emitting element 1 are electrically connected by the not-shown bonding wire, and the n-lead section 33 and the n-side electrode 180 (refer to FIG. 1) in the semiconductor light emitting element 1 are electrically connected by the not-shown bonding wire.

The sealing section 34 is configured with a transparent resin having high optical transparency in a visible region wavelength. As the resin constituting the sealing section 34, which satisfies the properties of high heat resistance, high weather resistance and high mechanical strength, for example, an epoxy resin or a silicone resin can be used.

It should be noted that an electronic appliance, such as a backlight, a traffic light, a mobile cellular telephone, a display, various kinds of panels and the like, a computer, a game machine and illumination incorporating the light emitting device 30 according to the exemplary embodiment, and a mechanical device incorporating those electronic appliances, such as an automobile, is equipped with the semiconductor light emitting element 1 having excellent light emitting properties. Especially, in the electronic appliance, such as the backlight, the mobile cellular telephone, the display, the game machine and the illumination, which are battery-powered, an excellent product equipped with the semiconductor light emitting element 1 having excellent light emitting properties can be provided; and therefore, it is favorable. In addition, the configuration of the light emitting device 30 including the semiconductor light emitting element 1 is not limited to that shown in FIGS. 3A and 3B, and a package configuration called, for example, a shell type may be employed.

Then, description will be given of light emitting operation of the light emitting device 30 shown in FIGS. 3A and 3B with reference to FIGS. 1, 2, 3A and 3B.

When a voltage in which the p-side electrode 170 is at the high potential and the n-side electrode 180 is at the low potential (a forward voltage VF) is applied to the semiconductor light emitting element 1 via the p-lead section 32 and the n-lead section 33 provided to the light emitting device 30, a current (a forward current IF) passes from the p-side electrode 170 toward the n-side electrode 180 through the p-type semiconductor layer 160, the light emitting layer 150 and the n-type semiconductor layer 140, and thereby light of the target light emission wavelength (green light) is outputted from the light emitting layer 150.

The light outputted from the light emitting layer 150 is further outputted to the outside of the semiconductor light emitting element 1, and is outputted from a top surface of the sealing section 34 to the outside of the light emitting device 30 directly or after being reflected by an inner wall surface provided in the concave section 31a of the housing 31.

Examples

Hereinafter, the present invention will be described further in detail with reference to examples. However, the present invention is not limited to the following examples as long as the scope of the gist thereof is not exceeded.

The present inventors formed the semiconductor light emitting elements 1 in which relationship between the compositions, structures and thicknesses are made variously different with respect to the barrier layer 151 (the first barrier layer 1511 to the fifth barrier layer 1515) and the well layer 152 (the first well layer 1521 to the fourth well layer 1524) in the light emitting layer 150, and performed evaluations related to the light emission output.

Here, Table 1 shows the structure of each component in each of the semiconductor light emitting elements 1 according to Examples 1 to 5, and Table 2 shows the structure of each component in each of the semiconductor light emitting elements 1 according to Examples 6 to 8 and Comparative Examples 1 to 3. In Tables 1 and 2, there are shown the configuration and the thickness in each of the substrate 110, the intermediate layer 120, the base layer 130, the n-type semiconductor layer 140 (the n-type contact layer 141 and the n-type cladding layer 142 (the n-type first cladding layer 1421 and the n-type second cladding layer 1422)), the light emitting layer 150 (the barrier layer 151 (the first barrier layer 1511 to the fifth barrier layer 1515) and the well layer 152 (the first well layer 1521 to the fourth sell layer 1524)) and the p-type semiconductor layer 160 (the p-type cladding layer 161 and the p-type contact layer 162 (the p-type first contact layer 1621 and the p-type second contact layer 1622)) in each of the semiconductor light emitting elements 1. However, in Examples and Comparative Examples, the substrate 110, the intermediate layer 120, the base layer 130, the n-type semiconductor layer 140, the p-type contact layer 162 in the p-type semiconductor layer 160, the p-side electrode 170 and the n-side electrode 180 are commonly structured. Moreover, the semiconductor light emitting element 1 described in the above exemplary embodiment corresponds to Example 1 shown in Table 1. It should be noted that, in this specific example, a processed substrate having been subjected to asperity processing was used as the substrate 110, and a grinding process was applied to the back surface of the substrate 110 after forming the laminated semiconductor layer 100, to thereby set the thickness of the substrate 110 at 120 μm.

TABLE 1

| | Name of Component | | | Example 1 Configuration | Example 1 Thickness | Example 2 Configuration | Example 2 Thickness | Example 3 Configuration | Example 3 Thickness | Example 4 Configuration | Example 4 Thickness | Example 5 Configuration | Example 5 Thickness |
|---|---|---|---|---|---|---|---|---|---|---|---|---|---|
| Laminated Semiconductor Layer 100 | Substrate 110 | | | Sapphire | 120 μm | Sapphire | 120 μm | Sapphire | 120 μm | Sapphire | 120 μm | Sapphire | 120 μm |
| | Intermediate Layer 120 | | | AlN | 30 nm | AlN | 30 nm | AlN | 30 nm | AlN | 30 nm | AlN | 30 nm |
| | Base Layer 130 | | | un-GaN | 6 μm | un-GaN | 6 μm | un-GaN | 6 μm | un-GaN | 6 μm | un-GaN | 6 μm |
| | N-Type Semiconductor Layer 140 | N-Type Contact Layer 141 | | Si—GaN | 5 μm | Si—GaN | 5 μm | Si—GaN | 5 μm | Si—GaN | 5 μm | Si—GaN | 5 μm |
| | | N-Type Cladding Layer 142 | N-Type First Cladding Layer 1421 | Si—GaInN | 2.0 nm | Si—GaInN | 2.0 nm | Si—GaInN | 2.0 nm | Si—GaInN | 2.0 nm | Si—GaInN | 2.0 nm |
| | | | N-Type Second Cladding Layer 1422 | Si—GaN | 2.0 nm | Si—GaN | 2.0 nm | Si—GaN | 2.0 nm | Si—GaN | 2.0 nm | Si—GaN | 2.0 nm |
| | Light Emitting Layer 150 | Barrier Layer 151 | First Barrier Layer 1511 | Si—GaN | 10.5 nm | Si—GaN | 10.5 nm | Si—GaN | 10.5 nm | Si—GaN | 10.5 nm | Si—GaN | 10.5 nm |
| | | Well Layer 152 | First Well Layer 1521 | GaInN (RW) | 3.0 nm | GaInN (RW) | 3.0 nm | GaInN (RW) | 3.0 nm | GaInN | 3.0 nm | GaInN | 3.0 nm |
| | | Barrier Layer 151 | Second Barrier Layer 1512 | un-GaN | 10.5 nm | un-GaN | 10.5 nm | un-GaN | 10.5 nm | un-GaN | 10.5 nm | un-GaN | 10.5 nm |
| | | Well Layer 152 | Second Well Layer 1522 | GaInN (RW) | 3.0 nm | GaInN (RW) | 3.0 nm | GaInN (RW) | 3.0 nm | GaInN | 3.0 nm | GaInN | 3.0 nm |
| | | Barrier Layer 151 | Third Barrier Layer 1513 | un-GaN | 10.5 nm | un-GaN | 10.5 nm | un-GaN | 10.5 nm | un-GaN | 10.5 nm | un-GaN | 10.5 nm |
| | | Well Layer 152 | Third Well Layer 1523 | GaInN | 3.0 nm | GaInN | 3.0 nm | GaInN | 3.0 nm | GaInN | 3.0 nm | GaInN | 3.0 nm |
| | | Barrier Layer 151 | Fourth Barrier Layer 1514 | un-GaN | 10.5 nm | un-GaN | 10.5 nm | un-GaN | 10.5 nm | un-GaN | 10.5 nm | un-GaN | 10.5 nm |
| | | Well Layer 152 | Fourth Well Layer 1524 | GaInN | 3.0 nm | GaInN | 3.0 nm | GaInN | 3.0 nm | GaInN | 3.0 nm | GaInN | 3.0 nm |
| | | Barrier Layer 151 | Fifth Barrier Layer 1515 | un-GaN | 8.0 nm | un-GaN | 8.0 nm | un-GaN | 8.0 nm | un-GaN | 8.0 nm | un-GaN | 8.0 nm |
| | P-Type Semiconductor Layer 160 | P-Type Cladding Layer 161 | | Mg—AlGaN | 8.0 nm | Mg—AlGaN | 8.0 nm | Mg—AlGaN | 8.0 nm | Mg—AlGaN | 5.0 nm | Mg—AlGaN | 8.0 nm |
| | | P-Type Contact Layer 162 | P-Type First Contact Layer 1621 | Mg—GaN | 135 nm | Mg—GaN | 135 nm | Mg—GaN | 135 nm | Mg—GaN | 135 nm | Mg—GaN | 135 nm |
| | | | P-Type Second Contact Layer 1622 | Mg—GaN | 25 nm | Mg—GaN | 25 nm | Mg—GaN | 25 nm | Mg—GaN | 25 nm | Mg—GaN | 25 nm |

TABLE 2

| Name of Component | | | Example 6 | | Example 7 | | Example 8 | |
|---|---|---|---|---|---|---|---|---|
| | | | Configuration | Thickness | Configuration | Thickness | Configuration | Thickness |
| Laminated Semiconductor Layer 100 | Substrate 110 | | Sapphire | 120 μm | Sapphire | 120 μm | Sapphire | 120 μm |
| | Intermediate Layer 120 | | AlN | 30 nm | AlN | 30 nm | AlN | 30 nm |
| | Base Layer 130 | | un-GaN | 6 μm | un-GaN | 6 μm | un-GaN | 6 μm |
| | N-Type Semiconductor Layer 140 | N-Type Contact Layer 141 | Si—GaN | 5 μm | Si—GaN | 5 μm | Si—GaN | 5 μm |
| | | N-Type Cladding Layer 142 — N-Type First Cladding Layer 1421 | Si—GaInN | 2.0 nm | Si—GaInN | 2.0 nm | Si—GaInN | 2.0 nm |
| | | N-Type Second Cladding Layer 1422 | Si—GaN | 2.0 nm | Si—GaN | 2.0 nm | Si—GaN | 2.0 nm |
| | Light Emitting Layer 150 | Barrier Layer 151 — First Barrier Layer 1511 | Si—GaN | 10.5 nm | Si—GaN | 10.5 nm | Si—GaN | 10.5 nm |
| | | Well Layer 152 — First Well Layer 1521 | GaInN (RW) | 3.0 nm | GaInN (RW) | 3.0 nm | GaInN (RW) | 3.0 nm |
| | | Barrier Layer 151 — Second Barrier Layer 1512 | un-GaN | 10.5 nm | un-GaN | 10.5 nm | un-GaN | 10.5 nm |
| | | Well Layer 152 — Second Well Layer 1522 | GaInN (RW) | 3.0 nm | GaInN (RW) | 3.0 nm | GaInN (RW) | 3.0 nm |
| | | Barrier Layer 151 — Third Barrier Layer 1513 | un-GaN | 10.5 nm | un-GaN | 10.5 nm | un-GaN | 10.5 nm |
| | | Well Layer 152 — Third Well Layer 1523 | GaInN (RW) | 3.0 nm | GaInN (RW) | 3.0 nm | GaInN (RW) | 3.0 nm |
| | | Barrier Layer 151 — Fourth Barrier Layer 1514 | un-GaN | 10.5 nm | un-GaN | 10.5 nm | un-GaN | 10.5 nm |
| | | Well Layer 152 — Fourth Well Layer 1524 | GaInN | 3.0 nm | GaInN | 3.0 nm | GaInN | 3.0 nm |
| | | Barrier Layer 151 — Fifth Barrier Layer 1515 | un-GaN | 8.0 nm | un-GaN | 8.0 nm | un-GaN | 8.0 nm |
| | P-Type Semiconductor Layer 160 | P-Type Cladding Layer 161 | Mg—AlGaN | 8.0 nm | Mg—AlGaN | 2.5 nm | Mg—AlGaN | 10.0 nm |
| | | P-Type Contact Layer 162 — P-Type First Contact Layer 1621 | Mg—GaN | 135 nm | Mg—GaN | 135 nm | Mg—GaN | 135 nm |
| | | P-Type Second Contact Layer 1622 | Mg—GaN | 25 nm | Mg—GaN | 25 nm | Mg—GaN | 25 nm |

| Name of Component | | | Comparative Example 1 | | Comparative Example 2 | | Comparative Example 3 | |
|---|---|---|---|---|---|---|---|---|
| | | | Configuration | Thickness | Configuration | Thickness | Configuration | Thickness |
| Laminated Semiconductor Layer 100 | Substrate 110 | | Sapphire | 120 μm | Sapphire | 120 μm | Sapphire | 120 μm |
| | Intermediate Layer 120 | | AlN | 30 nm | AlN | 30 nm | AlN | 30 nm |
| | Base Layer 130 | | un-GaN | 6 μm | un-GaN | 6 μm | un-GaN | 6 μm |
| | N-Type Semiconductor Layer 140 | N-Type Contact Layer 141 | Si—GaN | 5 μm | Si—GaN | 5 μm | Si—GaN | 5 μm |
| | | N-Type Cladding Layer 142 — N-Type First Cladding Layer 1421 | Si—GaInN | 2.0 nm | Si—GaInN | 2.0 nm | Si—GaInN | 2.0 nm |
| | | N-Type Second Cladding Layer 1422 | Si—GaN | 2.0 nm | Si—GaN | 2.0 nm | Si—GaN | 2.0 nm |
| | Light Emitting Layer 150 | Barrier Layer 151 — First Barrier Layer 1511 | un-GaN | 10.5 nm | un-GaN | 10.5 nm | un-GaN | 10.5 nm |
| | | Well Layer 152 — First Well Layer 1521 | GaInN (RW) | 3.0 nm | GaInN (RW) | 3.0 nm | GaInN (RW) | 3.0 nm |
| | | Barrier Layer 151 — Second Barrier Layer 1512 | un-GaN | 10.5 nm | un-GaN | 10.5 nm | un-GaN | 10.5 nm |
| | | Well Layer 152 — Second Well Layer 1522 | GaInN (RW) | 3.0 nm | GaInN (RW) | 3.0 nm | GaInN (RW) | 3.0 nm |

TABLE 2-continued

| | | | | | | |
|---|---|---|---|---|---|---|
| | Barrier Layer 151 | Third Barrier Layer 1513 | un-GaN | 10.5 nm un-GaN | 10.5 nm un-GaN | 10.5 nm |
| | Well Layer 152 | Third Well Layer 1523 | GaInN | 3.0 nm GaInN | 3.0 nm GaInN | 3.0 nm |
| | Barrier Layer 151 | Fourth Barrier Layer 1514 | un-GaN | 10.5 nm un-GaN | 10.5 nm un-GaN | 10.5 nm |
| | Well Layer 152 | Fourth Well Layer 1524 | GaInN | 3.0 nm GaInN | 3.0 nm GaInN | 3.0 nm |
| | Barrier Layer 151 | Fifth Barrier Layer 1515 | un-GaN | 8.0 nm un-GaN | 10.5 nm un-GaN | 2.5 nm |
| P-Type Semiconductor Layer 160 | P-Type Cladding Layer 161 | | Mg—AlGaN | 8.0 nm Mg—AlGaN | 8.0 nm Mg—AlGaN | 8.0 nm |
| | P-Type Contact Layer 162 | P-Type First Contact Layer 1621 | Mg—GaN | 135 nm Mg—GaN | 135 nm Mg—GaN | 135 nm |
| | | P-Type Second Contact Layer 1622 | Mg—GaN | 25 nm Mg—GaN | 25 nm Mg—GaN | 25 nm |

Moreover, FIGS. 4A to 4E are diagrams showing structures of the light emitting layers 150 and peripheries thereof in the semiconductor light emitting elements 1 in Examples 1 to 5 (refer to Table 1), respectively, and FIGS. 5A to 5F are diagrams showing structures of the light emitting layers 150 and peripheries thereof in the semiconductor light emitting elements 1 in Examples 6 to 8 and Comparative Examples 1 to 3 (refer to Table 2), respectively.

It should be noted that, in this description, GaN not doped with Si or Mg is represented as "un-GaN", GaN doped with Si is represented as "Si—GaN", and GaN doped with Mg is represented as "Mg—GaN". Further, GaInN not doped with Si or Mg is represented as "GaInN" and GaInN doped with Si is represented as "Si—GaInN". Still further, AlN not doped with Si or Mg is simply represented as "AlN" and AlGaN doped with Mg is represented as "Mg—AlGaN". Moreover, in the well layer 152 constituting the light emitting layer 150, the layer composed of GaInN with uniform thickness (the flat layer) is represented as "GaInN", and the layer composed of GaInN with non-uniform thickness (the non-flat layer, the rough well) is represented as "GaInN (RW)".

Here, in the semiconductor light emitting element 1 in Example 1, in the barrier layer 151 having the 5-layer configuration, the first barrier layer 1511 is composed of Si—GaN and the second barrier layer 1512 to the fifth barrier layer 1515 are composed of un-GaN. Moreover, in the semiconductor light emitting element 1 in Example 1, in the barrier layer 151 having the 5-layer configuration, the first barrier layer 1511 to the fourth barrier layer 1514 are set at the first thickness (10.5 nm) and the fifth barrier layer 1515 is set at the second thickness (8.0 nm). Further, in the semiconductor light emitting element 1 in Example 1, in the well layer 152 having the 4-layer configuration, each of the first well layer 1521 to the fourth well layer 1524 is composed of GaInN. In addition, in the semiconductor light emitting element 1 in Example 1, in the well layer 152 having the 4-layer configuration, the first well layer 1521 and the second well layer 1522 have the non-flat structures (RW) and the third well layer 1523 and the fourth well layer 1524 have the flat structures. Further, in the semiconductor light emitting element 1 in Example 1, in the well layer 152 having the 4-layer configuration, the first well layer 1521 to the fourth well layer 1524 are set at the standard well thickness (3.0 nm). Then, in the semiconductor light emitting element 1 in Example 1, the p-type cladding layer 161 is composed of Mg—AlGaN and the thickness thereof is set at 8.0 nm.

In contrast, the semiconductor light emitting element 1 in Example 2 is different from that in Example 1 in the point that, in the well layer 152 having the 4-layer configuration, only the first well layer 1521 has the non-flat structure, and the rest of the layers, namely, the second well layer 1522 to the fourth well layer 1524 have the flat structures (the point that the second well layer 1522 has the flat structure).

Moreover, the semiconductor light emitting element 1 in Example 3 is different from that in Example 1 in the point that, in the barrier layer 151 having the 5-layer configuration, all the first barrier layer 1511 to the fifth barrier layer 1515 are set at the first thickness (10.5 nm) (the point that the fifth barrier layer 1515 is set at the first thickness).

Further, the semiconductor light emitting element 1 in Example 4 is different from that in Example 1 in the point that the thickness of the p-type cladding layer 161 is set at 5.0 nm.

Still further, the semiconductor light emitting element 1 in Example 5 is different from that in Example 1 in the point that, in the well layer 152 having the 4-layer configuration, all the first well layer 1521 to the fourth well layer 1524 have the flat structures (the point that both first well layer 1521 and second well layer 1522 have the flat structures).

Moreover, the semiconductor light emitting element 1 in Example 6 is different from that in Example 1 in the point that, in the well layer 152 having the 4-layer configuration, the first well layer 1521 to the third well layer 1523 have the non-flat structures, and only the fourth well layer 1524 has the flat structure (the point that the third well layer 1523 has the non-flat structure).

Further, the semiconductor light emitting element 1 in Example 7 is different from that in Example 1 in the point that the thickness of the p-type cladding layer 161 is set at 2.5 nm, and the semiconductor light emitting element 1 in Example 8 is different from that in Example 1 in the point that the thickness of the p-type cladding layer 161 is set at 10.0 nm.

On the other hand, the semiconductor light emitting element 1 in Comparative Example 1 is different from that in Example 1 in the point that, in the barrier layer 151 having the 5-layer configuration, all the first barrier layer 1511 to the fifth barrier layer 1515 are composed of un-GaN (the point that the first barrier layer 1511 is composed of un-GaN).

Moreover, the semiconductor light emitting element 1 in Comparative Example 2 is different from that in Example 1 in the point that, in the barrier layer 151 having the 5-layer configuration, all the first barrier layer 1511 to the fifth barrier layer 1515 are composed of un-GaN (the point that the first barrier layer 1511 is composed of un-GaN), and in the point that all the first barrier layer 1511 to the fifth barrier layer 1515 are set at the first thickness (10.5 nm) (the point that the fifth barrier layer 1515 is set at the first thickness). Further, the semiconductor light emitting element 1 in Comparative Example 2 is also different from that in Example 1 in the point that, in the well layer 152 having the 4-layer configuration, all the first well layer 1521 to the fourth well layer 1524 have the flat structures (the point that both first well layer 1521 and second well layer 1522 have the flat structures).

Then, the semiconductor light emitting element 1 in Comparative Example 3 is different from that in Example 1 in the point that, in the barrier layer 151 having the 5-layer configuration, all the first barrier layer 1511 to the fifth barrier layer 1515 are composed of un-GaN (the point that the first barrier layer 1511 is composed of un-GaN), and in the point that the fifth barrier thickness t15 in the fifth barrier layer 1515 is small (2.5 nm). Moreover, the semiconductor light emitting element 1 in Comparative Example 3 is also different from that in Example 1 in the point that, in the well layer 152 having the 4-layer configuration, all the first well layer 1521 to the fourth well layer 1524 have the flat structures (the point that the first well layer 1521 and the second well layer 1522 have the flat structures).

Here, in each of the semiconductor light emitting elements 1 in Examples 1 to 8 and Comparative Examples 1 to 3, the compositional ratio of Ga and In in GaInN constituting the well layer 152 was adjusted in manufacturing so as to cause light outputted from each semiconductor light emitting element 1 to have a dominant light emission wavelength WD of 525 nm, and accordingly, the value of y was set at y=0.12. Then, the forward current IF of 20 mA was supplied to each semiconductor light emitting element 1 that has been obtained, to thereby measure the light emission output Po at that time.

FIG. 6 is a graph showing the light emission outputs Po by the semiconductor light emitting elements 1 according to above-described Examples 1 to 8 and Comparative Examples 1 to 3. Here, the light emission output Po of 11.5 mW could be obtained in Example 1, the light emission output Po of 10.8 mW could be obtained in Example 2, the light emission output Po of 10.9 mW could be obtained in Example 3, the light emission output Po of 11.3 mW could be obtained in Example 4, the light emission output Po of 10.1 mW could be obtained in Example 5, the light emission output Po of 10.5 mW could be obtained in Example 6, the light emission output Po of 10.2 mW could be obtained in Example 7 and the light emission output Po of 10.4 mW could be obtained in Example 8. In contrast, in Comparative Examples 1 to 3, the light emission outputs Po of merely 9.1 mW, 8.4 mW and 7.6 mW, respectively, were obtained.

From the above-described results, it is possible to improve the light emission output Po by causing the first barrier layer 1511 of the first barrier layer 1511 to the fifth barrier layer 1515 constituting the barrier layer 151 in the light emitting layer 150, which is nearest the n-type semiconductor layer 140, to contain the n-type impurities (Si) as in Examples 1 to 8, compared to the case where the n-type impurities are not contained in the first barrier layer 1515 as in Comparative Examples 1 to 3.

Moreover, it is also possible to improve the light emission output Po by setting the thickness of the fifth barrier layer 1515 of the first barrier layer 1511 to the fifth barrier layer 1515 constituting the barrier layer 151 in the light emitting layer 150, which is nearest the p-type semiconductor layer 160, smaller than the thicknesses of the other layers, namely, the first barrier layer 1511 to the fourth barrier layer 1514 as in Example 1, compared to the case where the thickness of the fifth barrier layer 1515 is set to be the same as the thicknesses of the first barrier layer 1511 to the fourth barrier layer 1514 as in Example 3.

Further, it is also possible to improve the light emission output Po by setting the thickness of the p-type cladding layer 161 larger than the thickness of each of the first well layer 1521 to the fourth well layer 1524 constituting the well layer 152 in the light emitting layer 150 as in Examples 1 and 4, compared to the case where the thickness of the p-type cladding layer 161 is set smaller than the thickness of each of the first well layer 1521 to the fourth well layer 1524 as in Example 7.

Moreover, it is also possible to improve the light emission output Po by setting the thickness of the p-type cladding layer 161 not more than the thickness of the fifth barrier layer 1515 constituting the barrier layer 151 in the light emitting layer 150, in which the thickness thereof is set at the second thickness, as in Examples 1 and 4, compared to the case where the thickness of the p-type cladding layer 161 is set larger than the thickness of the fifth barrier layer 1515 as in Example 8.

Still further, it is also possible to improve the light emission output Po by forming the two layers of the first well layer 1521 to the fourth well layer 1524 constituting the well layer 152 in the light emitting layer 150, namely, the first well layer 1521 and the second well layer 1522, which are on the side nearest the n-type semiconductor layer 140, as the non-flat layers (RW) as in Example 1, compared to the cases where only the first well layer 1521 is formed as the non-flat layer as in Example 2, where all the first well layer 1521 to the fourth well layer 1524 are formed as the flat layers as in Example 5, and where the three layers, namely, the first well layer 1521 to the third well layer 1523 are formed as the non-flat layers as in Example 6.

As the semiconductor light emitting element 1 using the group III nitride semiconductor, there are known those emitting ultraviolet light, those emitting blue light, those emitting green light, and so forth. Here, the band gap of GaN is about 3.39 eV at room temperature, and in the case where GaN is used for the well layer 152, the light emission wavelength in the neighborhood of 365 nm (ultraviolet light) can be obtained. Then, in the case where the longer light emission wavelength is to be obtained, GaInN, in which In is further added to GaN, is used as the well layer 152. Accordingly, in the case where green light, which is on the longer wavelength side, is to be obtained, the rate of In in GaInN is increased and the lattice constant of crystals constituting the well layer 152 becomes large compared to the case where blue light is to be obtained.

At this time, as the barrier layer 151 constituting the light emitting layer 150 together with the well layer 152, GaN is frequently used regardless whether the light emission wavelength is of blue light or green light. For this reason, in the semiconductor light emitting element 1 that emits green light by use of the group III nitride semiconductor, the difference in composition between the barrier layer 151 and the well layer 152 in the light emitting layer 150 becomes large compared to the semiconductor light emitting element 1 that emits blue light by use of the group III nitride semiconductor. With this, the light emission efficiency is prone to be reduced due to increased lattice misfit between the barrier layer 151 and the well layer 152, and as a result, obtained light emission output Po is also reduced.

In contrast, it is considered that, by causing the first barrier layer 1511 that is laminated first in the light emitting layer 150 to be doped with Si, it becomes possible to mediate the lattice misfit in the first barrier layer 1511, which is an initial layer in the light emitting layer 150, and further, the doping contributes to mediated deformation inside the light emitting layer 150.

It should be noted that description has been given by taking the case where the barrier layer 151 has the 5-layer configuration (the first barrier layer 1511 to the fifth barrier layer 1515) and the well layer 152 has the 4-layer configuration (the first well layer 1521 to the fourth well layer 1524) in the light emitting layer 150 as a specific example; however, configurations are not limited thereto, and the present invention can be applied to those including the barrier layer 151 with n-layer configuration (n≥5) and the well layer 152 with (n−1)-layer configuration.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
an n-type semiconductor layer that is composed of a group III nitride semiconductor doped with an n-type impurity;
a light emitting layer that is laminated on the n-type semiconductor layer and composed of a group III nitride semiconductor, the light emitting layer emitting light having a wavelength of not less than 500 nm and not more than 570 nm by passing a current; and
a p-type semiconductor layer that is laminated on the light emitting layer and composed of a group III nitride semiconductor doped with a p-type impurity,
wherein the light emitting layer comprises:
at least four well layers that are composed of a group III nitride semiconductor; and
at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at an interface portion with the p-type semiconductor layer, and
wherein, of the at least five barrier layers, one n-side barrier layer provided at the interface portion with the n-type semiconductor layer is doped with the n-type impurity, and, of the at least five barrier layers, at least four barrier layers except for the n-side barrier layer are not doped with the n-type impurity.

2. The semiconductor light emitting element according to claim 1, wherein,
of the at least five barrier layers, each of at least four barrier layers except for one p-side barrier layer provided at the interface portion with the p-type semiconductor layer has a first thickness, and, of the at least five barrier layers, the p-side barrier layer has a second thickness that is smaller than the first thickness.

3. The semiconductor light emitting element according to claim 2, wherein the p-type semiconductor layer comprises a p-type cladding layer laminated on the light emitting layer and a p-type contact layer laminated on the p-type cladding layer, and the p-type cladding layer has a thickness larger than a thickness of each of the at least four well layers and not more than the second thickness of the p-side barrier layer.

4. The semiconductor light emitting element according to claim 1, wherein, of the at least four well layers, each of a first well layer nearest the n-type semiconductor layer and a second well layer nearest the n-type semiconductor layer next after the first well layer is configured to have a non-uniform thickness, and, of the at least four well layers, each of at least two layers except for the first well layer and the second well layer is configured to have a uniform thickness.

5. The semiconductor light emitting element according to claim 1, wherein the n-type semiconductor layer has a superlattice structure configured by alternately laminating a first layer composed of a group III nitride semiconductor and a second layer composed of a group III nitride semiconductor having a composition different from a composition of the group III nitride semiconductor constituting the first layer.

6. The semiconductor light emitting element according to claim 1, wherein each of the at least five barrier layers is composed of GaN and each of the at least four well layers is composed of GaInN, and each of the at least four well layers is set to have a common thickness and a common composition.

7. A light emitting device comprising:
a base section in which a first wiring and a second wiring are formed; and
a semiconductor light emitting element that emits light by passing a current via the first wiring and the second wiring,
the semiconductor light emitting element comprising:
an n-type semiconductor layer that is composed of a group III nitride semiconductor doped with an n-type impurity;
a light emitting layer that is laminated on the n-type semiconductor layer and composed of a group III nitride semiconductor, the light emitting layer emitting light having a wavelength of not less than 500 nm and not more than 570 nm by passing a current;
a p-type semiconductor layer that is laminated on the light emitting layer and composed of a group III nitride semiconductor doped with a p-type impurity;
a p-side electrode for electrically connecting the p-type semiconductor layer and the first wiring; and
an n-side electrode for electrically connecting the n-type semiconductor layer and the second wiring,
wherein the light emitting layer comprises:
at least four well layers that are composed of a group III nitride semiconductor; and
at least five barrier layers that are composed of a group III nitride semiconductor whose band gap is larger than a band gap of the group III nitride semiconductor of the well layers, the barrier layers sandwiching each of the at least four well layers from both sides, being connected to the n-type semiconductor layer at an interface portion with the n-type semiconductor layer and being connected to the p-type semiconductor layer at an interface portion with the p-type semiconductor layer, and wherein, of the at least five barrier layers, one n-side barrier layer provided at the interface portion with the n-type semiconductor layer is doped with the n-type impurity, and, of the at least five barrier layers, at least four barrier layers except for the n-side barrier layer are not doped with the n-type impurity.

* * * * *